United States Patent
Kusuda

(10) Patent No.: US 9,180,550 B2
(45) Date of Patent: Nov. 10, 2015

(54) HEAT TREATMENT APPARATUS FOR HEATING SUBSTRATE BY LIGHT IRRADIATION

(71) Applicant: DAINIPPON SCREEN MFG. CO., LTD., Kyoto (JP)

(72) Inventor: Tatsufumi Kusuda, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 286 days.

(21) Appl. No.: 13/752,422

(22) Filed: Jan. 29, 2013

(65) Prior Publication Data

US 2013/0248504 A1    Sep. 26, 2013

(30) Foreign Application Priority Data

Mar. 22, 2012  (JP) ................................. 2012-064628

(51) Int. Cl.
| | |
|---|---|
| *B23K 26/00* | (2014.01) |
| *H01L 21/324* | (2006.01) |
| *B23K 26/12* | (2014.01) |
| *H01L 21/67* | (2006.01) |

(52) U.S. Cl.
CPC ......... *B23K 26/0066* (2013.01); *B23K 26/0042* (2013.01); *B23K 26/127* (2013.01); *H01L 21/324* (2013.01); *H01L 21/67115* (2013.01); *H01L 21/67248* (2013.01)

(58) Field of Classification Search
CPC ............ H01L 21/324; H01L 21/67248; H01L 21/67115; B23K 26/0066; B23K 26/127; B23K 26/0042
See application file for complete search history.

(56) References Cited

U.S. PATENT DOCUMENTS

| | | | | |
|---|---|---|---|---|
| 3,646,471 | A | * | 2/1972 | DeMent .......................... 372/77 |
| 4,581,248 | A | * | 4/1986 | Roche ............................ 427/554 |
| 4,649,261 | A | * | 3/1987 | Sheets ............................ 219/390 |
| 4,796,562 | A | * | 1/1989 | Brors et al. .................... 118/725 |

(Continued)

FOREIGN PATENT DOCUMENTS

| | | |
|---|---|---|
| JP | H-06-260436 | 9/1994 |
| JP | 2003-086528 | 3/2003 |

(Continued)

OTHER PUBLICATIONS

Office Action issued by Taiwanese Patent Office on Mar. 24, 2015 in connection with corresponding Taiwanese Application No. 10-2100754 with Japanese and English Translation thereof.

(Continued)

*Primary Examiner* — Eric Stapleton
(74) *Attorney, Agent, or Firm* — Ostrolenk Faber LLP

(57) ABSTRACT

The temperature of a semiconductor wafer is raised by light irradiation heating performed by halogen lamps. An infrared ray emitted from the semiconductor wafer whose temperature has been raised transmits through an infrared-transparent window made of silicon, and then is detected by an infrared camera. The infrared camera two-dimensionally detects the temperature of an entire surface of the semiconductor wafer. Based on a result of the detection obtained by the infrared camera, a temperature drop region having a relatively low temperature among the region of the semiconductor wafer is irradiated with laser light emitted from a laser light emission part. Accordingly, without rotating the semiconductor wafer, a temperature distribution can be made uniform with a high accuracy throughout the entire surface of the semiconductor wafer.

9 Claims, 11 Drawing Sheets

(56) References Cited

U.S. PATENT DOCUMENTS

| | | | |
|---|---|---|---|
| 4,893,815 A * | 1/1990 | Rowan | 463/47.3 |
| 5,000,113 A * | 3/1991 | Wang et al. | 118/723 E |
| 5,155,336 A * | 10/1992 | Gronet et al. | 219/411 |
| 5,217,559 A * | 6/1993 | Moslehi et al. | 156/345.35 |
| 5,317,492 A * | 5/1994 | Gronet et al. | 362/294 |
| 5,407,119 A * | 4/1995 | Churchill et al. | 228/124.5 |
| 5,487,127 A * | 1/1996 | Gronet et al. | 392/416 |
| 5,683,173 A * | 11/1997 | Gronet et al. | 362/294 |
| 5,689,614 A * | 11/1997 | Gronet et al. | 392/416 |
| 5,708,755 A * | 1/1998 | Gronet et al. | 392/416 |
| 5,743,643 A * | 4/1998 | Gronet et al. | 374/121 |
| 5,767,486 A * | 6/1998 | Gronet et al. | 219/411 |
| 5,790,751 A * | 8/1998 | Gronet et al. | 392/416 |
| 5,840,125 A * | 11/1998 | Gronet et al. | 118/730 |
| 5,912,257 A * | 6/1999 | Prasad et al. | 514/356 |
| 6,016,383 A * | 1/2000 | Gronet et al. | 392/416 |
| 6,122,439 A * | 9/2000 | Gronet et al. | 392/416 |
| 6,122,440 A * | 9/2000 | Campbell | 392/420 |
| 6,326,597 B1 * | 12/2001 | Lubomirsky et al. | 219/494 |
| 6,391,804 B1 * | 5/2002 | Grant et al. | 438/795 |
| 6,402,037 B1 * | 6/2002 | Prasad et al. | 235/487 |
| 6,434,327 B1 * | 8/2002 | Gronet et al. | 392/416 |
| 6,528,397 B1 * | 3/2003 | Taketomi et al. | 438/487 |
| 6,559,424 B2 * | 5/2003 | O'Carroll et al. | 219/390 |
| 6,563,092 B1 * | 5/2003 | Shrinivasan et al. | 219/502 |
| 6,598,559 B1 * | 7/2003 | Vellore et al. | 118/723 VE |
| 6,717,158 B1 * | 4/2004 | Gat et al. | 250/492.2 |
| 6,771,895 B2 * | 8/2004 | Gat et al. | 392/416 |
| 6,806,498 B2 * | 10/2004 | Taketomi et al. | 257/64 |
| 6,941,063 B2 * | 9/2005 | Camm et al. | 392/416 |
| 6,986,294 B2 * | 1/2006 | Fromme et al. | 73/865.8 |
| 7,038,174 B2 * | 5/2006 | Gat et al. | 219/390 |
| 7,102,141 B2 * | 9/2006 | Hwang et al. | 250/455.11 |
| 7,501,607 B2 * | 3/2009 | Camm et al. | 219/679 |
| 7,547,633 B2 * | 6/2009 | Ranish et al. | 438/687 |
| 7,585,686 B2 * | 9/2009 | Verhaverbeke et al. | 438/16 |
| 7,608,802 B2 * | 10/2009 | Gat et al. | 219/390 |
| 8,236,706 B2 * | 8/2012 | Peuse et al. | 438/770 |
| 8,624,165 B2 * | 1/2014 | Kusuda et al. | 219/385 |
| 2002/0084424 A1 * | 7/2002 | O'Carroll et al. | 250/492.1 |
| 2002/0160553 A1 * | 10/2002 | Yamanaka et al. | 438/149 |
| 2002/0189757 A1 * | 12/2002 | Denton et al. | 156/345.27 |
| 2003/0022105 A1 * | 1/2003 | Prasad et al. | 430/270.15 |
| 2003/0022471 A1 * | 1/2003 | Taketomi et al. | 438/496 |
| 2004/0008980 A1 * | 1/2004 | Morimoto et al. | 392/418 |
| 2004/0031335 A1 * | 2/2004 | Fromme et al. | 73/865 |
| 2004/0084437 A1 * | 5/2004 | Timans | 219/390 |
| 2005/0134834 A1 * | 6/2005 | Davis et al. | 356/72 |
| 2006/0291835 A1 * | 12/2006 | Nozaki et al. | 392/416 |
| 2007/0093071 A1 * | 4/2007 | Verhaverbeke et al. | 438/724 |
| 2007/0298972 A1 * | 12/2007 | Kent et al. | 505/500 |
| 2008/0085477 A1 * | 4/2008 | Verhaverbeke et al. | 430/322 |
| 2008/0138917 A1 * | 6/2008 | Verhaverbeke et al. | 438/16 |
| 2008/0145797 A1 * | 6/2008 | Verbeke et al. | 430/322 |
| 2008/0214020 A1 * | 9/2008 | Ito et al. | 438/795 |
| 2010/0133255 A1 * | 6/2010 | Bahng et al. | 219/444.1 |
| 2010/0151694 A1 * | 6/2010 | Peuse et al. | 438/770 |
| 2010/0267173 A1 * | 10/2010 | Moffatt | 438/16 |
| 2011/0034015 A1 * | 2/2011 | Yoshino et al. | 438/585 |
| 2011/0265887 A1 * | 11/2011 | Lee et al. | 137/334 |
| 2012/0067864 A1 * | 3/2012 | Kusuda et al. | 219/385 |
| 2012/0298039 A1 * | 11/2012 | Peuse et al. | 118/723.1 |

FOREIGN PATENT DOCUMENTS

| | | |
|---|---|---|
| JP | 2004-296625 | 10/2004 |
| JP | 2009-260061 | 11/2009 |

OTHER PUBLICATIONS

Office Action issued by Korean Patent Office on Mar. 19, 2014 in connection with corresponding Korean Application No. 10-2013-0027250 with Japanese and English Translation thereof.

* cited by examiner

F I G . 3
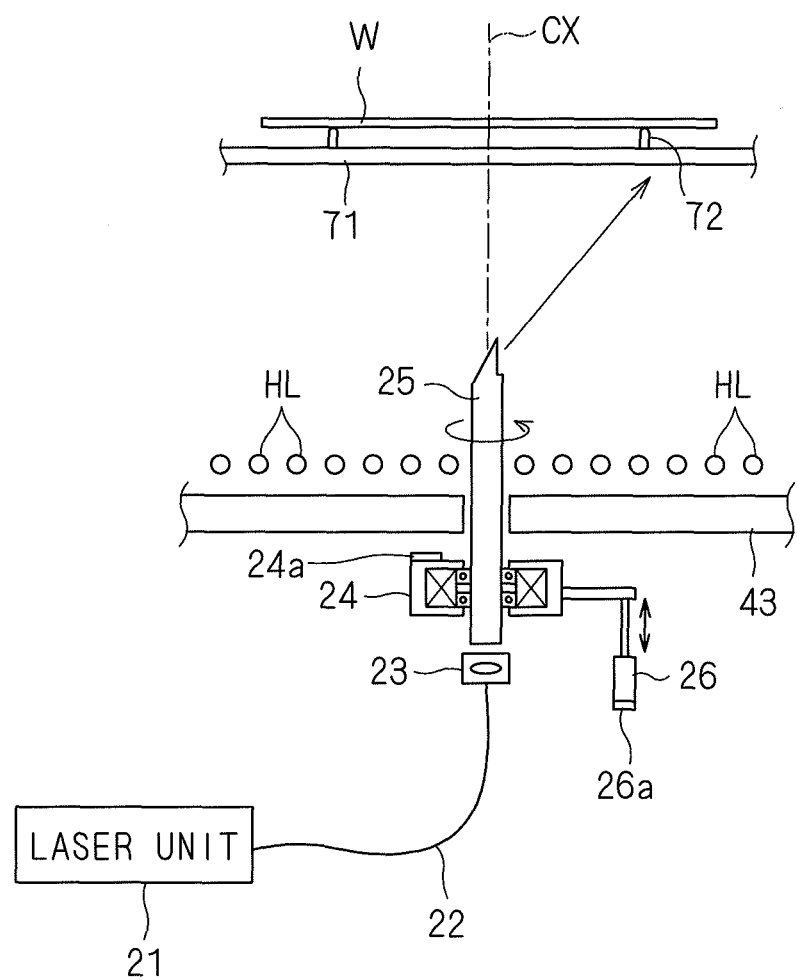

F I G . 5
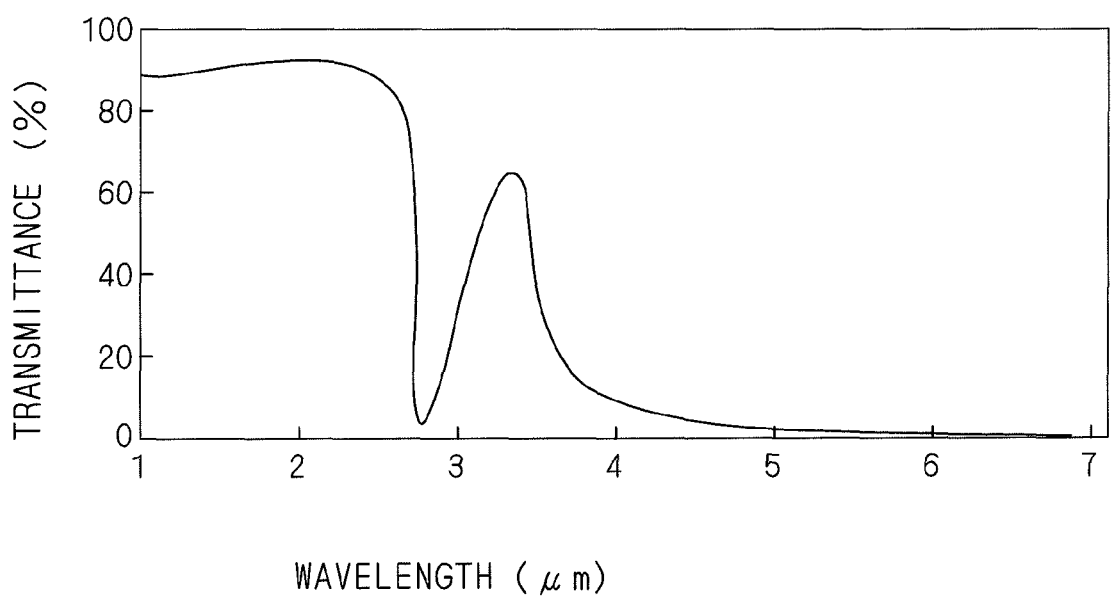

F I G . 6
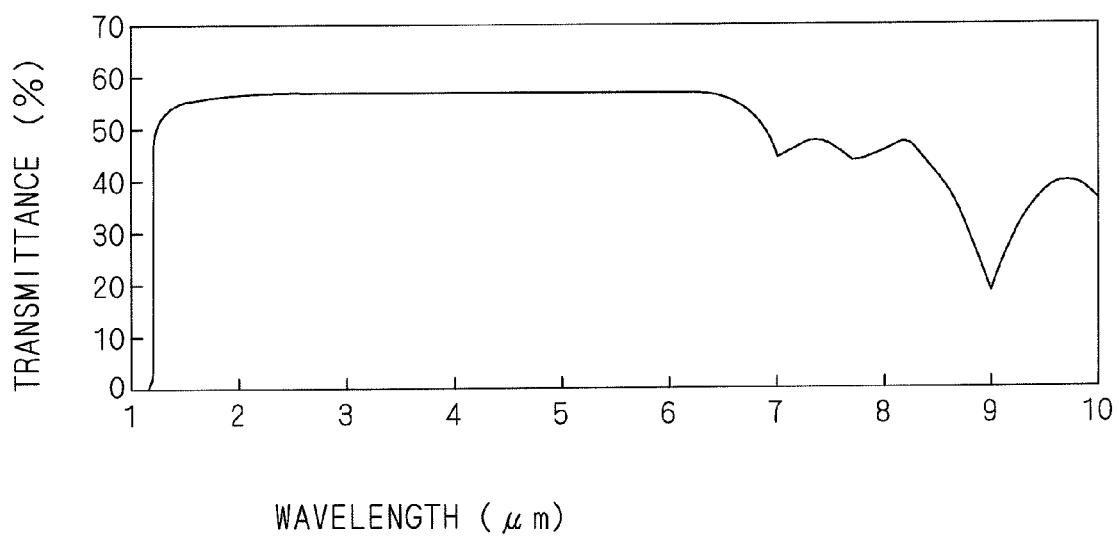

F I G . 8
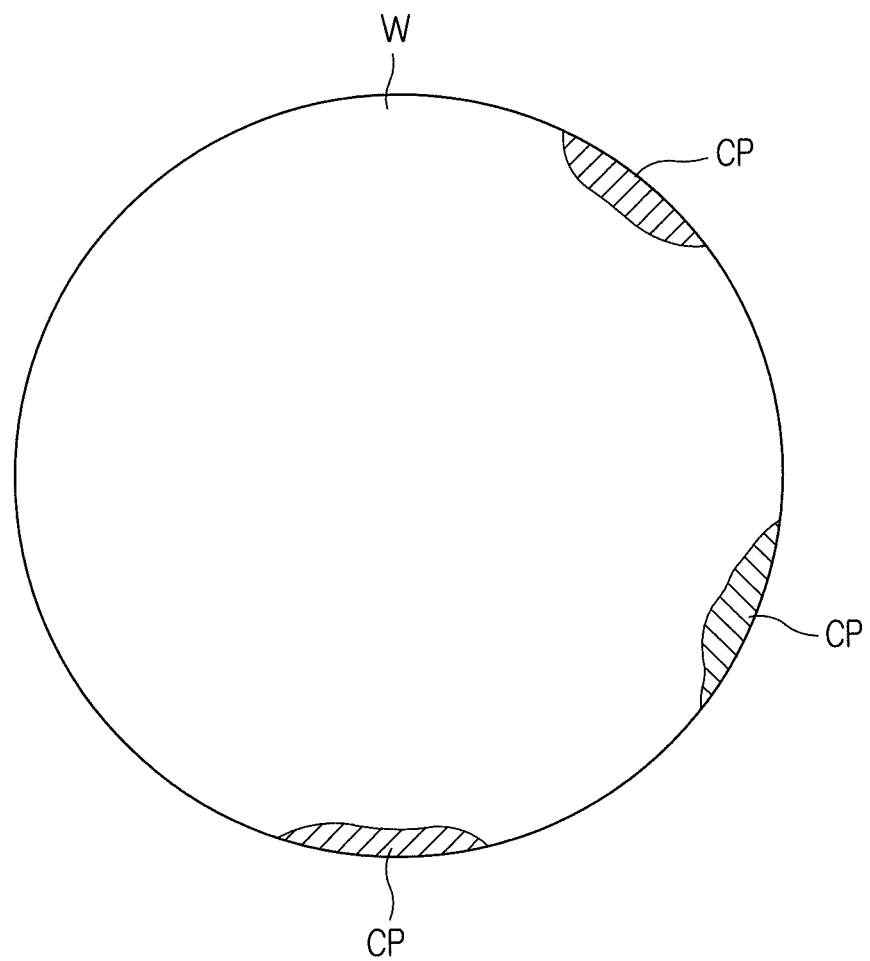

F I G. 9
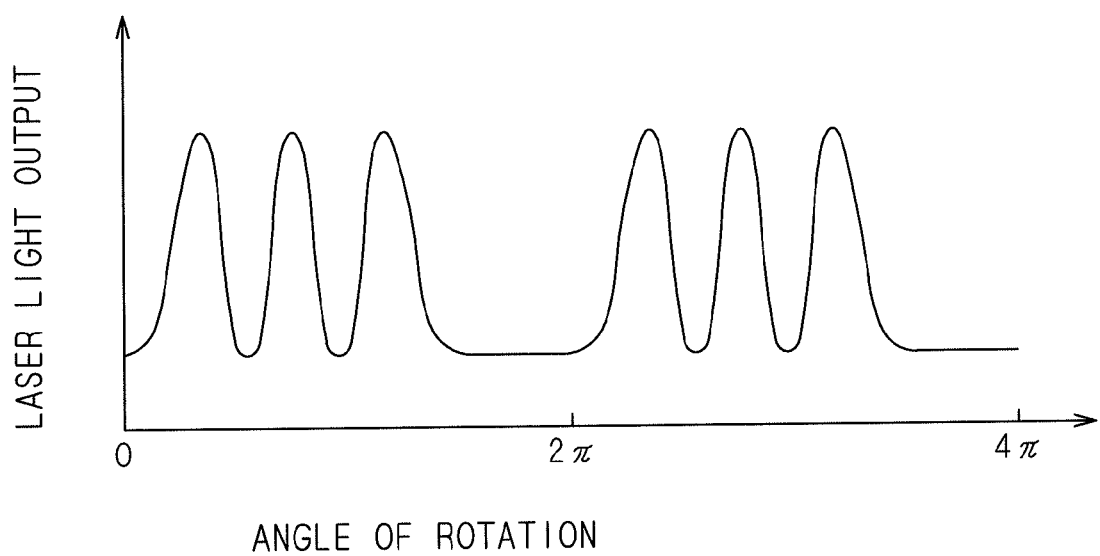

FIG. 10

HEAT TREATMENT APPARATUS FOR HEATING SUBSTRATE BY LIGHT IRRADIATION

BACKGROUND OF THE INVENTION

1. Field of the Invention

The present invention relates to a heat treatment apparatus for heating a thin plate-like precision electronic substrate (hereinafter, simply referred to as "substrate"), such as a semiconductor wafer and a glass substrate for a liquid crystal display device, by irradiating the substrate with light.

2. Description of the Background Art

Conventionally, in a process for manufacturing a semiconductor device and the like, various types of heat treatments are performed on a substrate such as a semiconductor wafer. As a heat treatment method on the semiconductor wafer, a rapid thermal process (RTP) has been in wide use. In a typical RTP apparatus, a semiconductor wafer held in a chamber is irradiated with light emitted from halogen lamps, so that the temperature of the semiconductor wafer is raised to a predetermined processing temperature in a short time of about several seconds. Rapidly raising the temperature of the semiconductor wafer achieves activation of impurities implanted through, for example, an ion implantation process, with suppression of diffusion of the impurities. By using the RTP apparatus, a spike annealing is also performed in which the temperature of a semiconductor wafer is rapidly raised without being held at the processing temperature and then, when the semiconductor wafer reaches the processing temperature, simultaneously a rapid drop in the temperature of the semiconductor wafer is started.

In this RTP apparatus, as disclosed in Japanese Patent Application Laid-Open No. 2003-86528 for example, a plurality of halogen lamps are divided into a plurality of zones and a pyrometer (radiation thermometer) corresponding to each of the zones is provided, so that an output of the halogen lamps is controlled on a zone basis based on a wafer temperature measured by the pyrometer. The pyrometer can measure the temperature of only a partial region of the semiconductor wafer. Therefore, in the RTP apparatus, the semiconductor wafer is rotated during the heat treatment, and thereby an average temperature among concentric zones is calculated. Based on the calculated result, a feed-back control on the halogen lamps is performed.

However, in the conventional RTP apparatus, in order to rotate the semiconductor wafer, it is necessary to provide a rotation mechanism in the chamber. Providing a wafer rotation mechanism in the chamber complicates a configuration of the apparatus and increases the size of the chamber. In addition, a problem arises that particles are inevitably generated from the rotation mechanism and scattered within the chamber.

Moreover, in a case of measuring the temperature while rotating the semiconductor wafer relative to the pyrometer, the average temperature among the concentric zones is measured. Therefore, it is impossible to detect local non-uniformity in the temperature distribution. Accordingly, in a case where a temperature drop region (cold spot) locally appears, a measurement temperature of the entire concentric region including the cold spot is lowered. Performing the feed-back control on the output of the halogen lamps based on such a measurement result may cause concentric non-uniformity in the temperature distribution.

In recent years, a back side annealing is attracting attention, in which the semiconductor wafer is irradiated with light at a back surface thereof, on which there is no pattern dependency of the light absorption rate. In a case of performing the back side annealing in the RTP apparatus, it is necessary to ensure access to the back surface of the semiconductor wafer to be irradiated with light, and therefore, it is necessary to support a peripheral portion of the wafer. This makes it likely that a temperature abnormality occurs particularly in the peripheral portion of the semiconductor wafer, which may cause warping of the wafer.

SUMMARY OF THE INVENTION

The present invention is directed to a heat treatment apparatus for heating a substrate by irradiating the substrate with light.

In an aspect of the present invention, the heat treatment apparatus includes: a chamber configured to receive a substrate; a holding part configured to hold the substrate within the chamber; a quartz window arranged at one end of the chamber; a halogen lamp configured to irradiate one side of the substrate held on the holding part with light through the quartz window; a temperature detection part configured to receive an infrared ray emitted from the other side of the substrate held on the holding part, and two-dimensionally detect the temperature of the other side; an infrared-transparent window arranged at the other end of the chamber and configured to allow an infrared ray in a wavelength region detectable by the temperature detection part to transmit therethrough; and a temperature correction part configured to, based on a result of the detection obtained by the temperature detection part, heat a temperature drop region having a relatively low temperature among a region of the substrate held on the holding part.

The halogen lamps irradiate the one side of the substrate held on the holding part with light through the quartz window, and an infrared ray emitted from the other side of this substrate is received through the infrared-transparent window, so that the temperature of the other side is two-dimensionally detected and, based on the result of the detection, the temperature drop region of the substrate having a relatively low temperature is heated. Accordingly, without rotating the substrate, the temperature of the entire surface of the substrate can be two-dimensionally detected, and the temperature distribution can be made uniform throughout the entire surface.

Preferably, the infrared-transparent window is made of silicon, germanium, or sapphire.

This can made sure that an infrared ray in the wavelength region detectable by the temperature detection part transmits through the infrared-transparent window.

Preferably, the heat treatment apparatus further includes a window cooling part configured to cool the infrared-transparent window to 150° C. or less.

This can prevent the infrared-transparent window from being heated by radiation heat generated from the substrate, which may otherwise cause the infrared-transparent window to be opaque to the infrared ray.

Therefore, an object of the present invention is to achieve a uniform temperature distribution throughout an entire surface of a substrate without rotating the substrate.

These and other objects, features, aspects and advantages of the present invention will become more apparent from the following detailed description of the present invention when taken in conjunction with the accompanying drawings.

BRIEF DESCRIPTION OF THE DRAWING

FIG. 3 is a diagram showing a configuration of a temperature correction part;

FIG. 5 is a diagram showing a spectral transmittance of quartz;

FIG. 6 is a diagram showing a spectral transmittance of silicon;

FIG. 8 is a diagram showing an example of a temperature map of the semiconductor wafer;

FIG. 9 is a diagram for explaining a modulation of a laser light output;

FIG. 10 is a diagram conceptually showing a situation of a temperature correction in a heat treatment apparatus according to a second preferred embodiment.

DESCRIPTION OF THE PREFERRED EMBODIMENTS

Hereinafter, some preferred embodiments of the present invention will be described in detail with reference to the accompanying drawings.

First Preferred Embodiment

Figure 1:
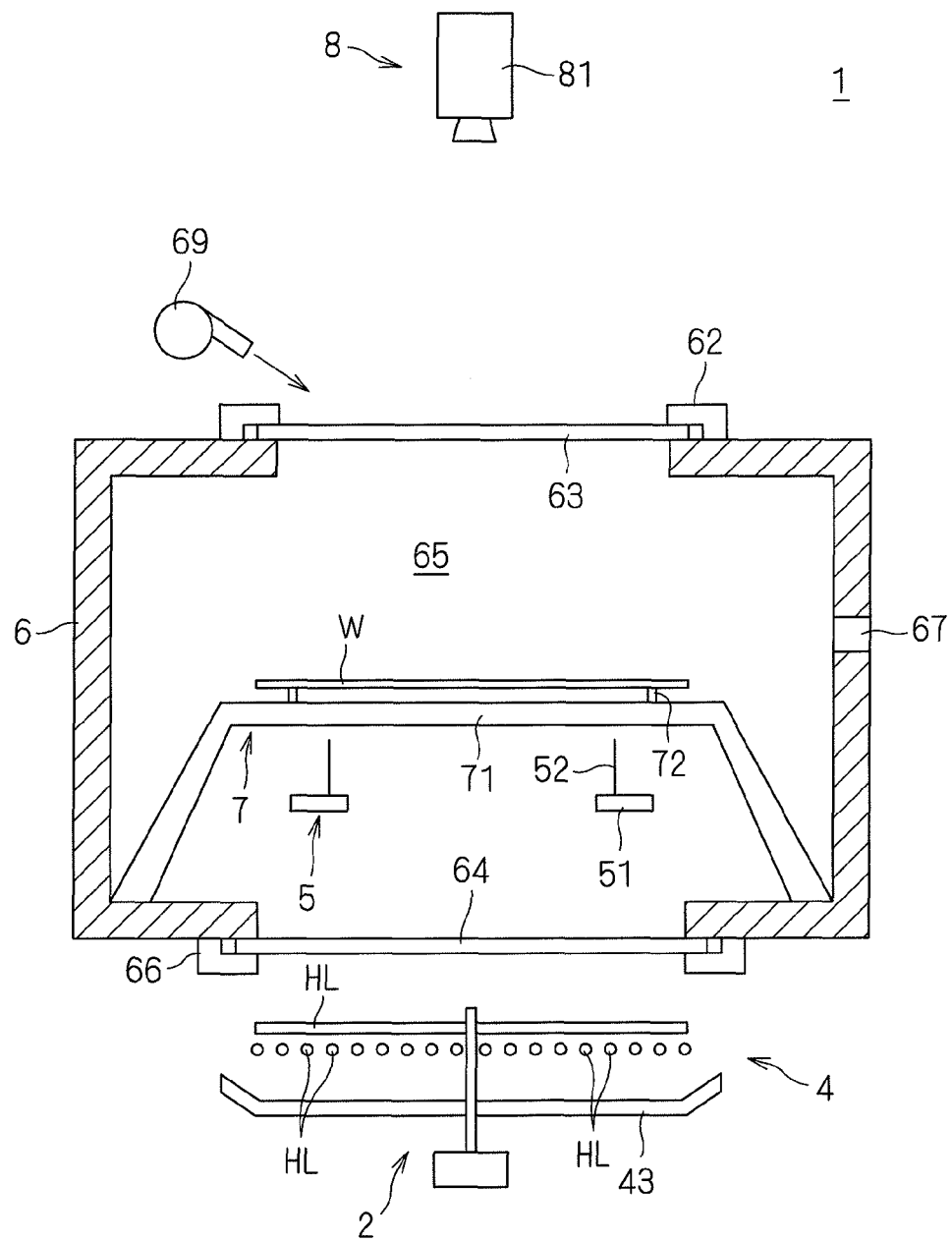
FIG. 1 is a diagram showing a configuration of principal parts of a heat treatment apparatus according to the present invention.

FIG. 1 is a diagram showing a configuration of principal parts of a heat treatment apparatus 1 according to the present invention. The heat treatment apparatus 1 is a lamp annealer that performs a heat treatment (back side annealing) on a substantially circular semiconductor wafer W by irradiating a back surface of the semiconductor wafer W with light. In FIG. 1 and subsequent Figures, the dimensions of components and the number of components are shown in an exaggerated or simplified form, as appropriate, for the sake of easier understanding.

The heat treatment apparatus 1 principally includes a chamber 6, a holder 7, a light irradiation part 4, a temperature detection part 8, and a temperature correction part 2. The chamber 6 has a substantially cylindrical shape, and receives the semiconductor wafer W therein. The holder 7 holds the semiconductor wafer W within the chamber 6. The light irradiation part 4 irradiates the semiconductor wafer W held on the holder 7 with light. The temperature detection part 8 detects the temperature of the semiconductor wafer W irradiated with light. The temperature correction part 2 corrects the temperature of a partial region of the semiconductor wafer W. The heat treatment apparatus 1 also includes a controller 3 that controls these parts and causes them to perform the heat treatment on the semiconductor wafer W.

A side wall of the chamber 6 has a substantially cylindrical shape with upper and lower ends thereof being opened. The chamber 6 is made of, for example, a metal material, such as stainless steel, with excellent strength and heat resistance. A quartz window 64 is mounted to a lower opening of the chamber 6, which is thereby closed. The quartz window 64, which is arranged at the lower end of the chamber 6, is a disk-shaped member made of quartz ($SiO_2$). The quartz window 64 allows light emitted from the light irradiation part 4 to transmit therethrough into the chamber 6.

An infrared-transparent window 63 is mounted to an upper opening of the chamber 6, which is thereby closed. The infrared-transparent window 63, which is arranged at the upper end of the chamber 6, is a disk-shaped member made of silicon (Si). In the first preferred embodiment, the diameter of the infrared-transparent window 63 is φ300 mm, the same diameter as that of the semiconductor wafer W. This infrared-transparent window 63 can be manufactured at a low cost by, for example, cutting out a circular disk having a predetermined thickness (in this preferred embodiment, 3 mm) from a single crystal silicon ingot from which the semiconductor wafer W is also cut out. Silicon is opaque to visible light (not allowing visible light to transmit therethrough), but allows infrared rays having a wavelength of more than 1 μm to transmit therethrough, as will be detailed later. Accordingly, infrared rays emitted from the semiconductor wafer W whose temperature has been raised by the light irradiation from the light irradiation part 4 transmits through the infrared-transparent window 63 arranged at the upper end of the chamber 6, and then is released to the upper side of the chamber 6.

A space enclosed by the quartz window 64, the infrared-transparent window 63, and the side wall of the chamber 6 is defined as a heat treatment space 65. To maintain the hermeticity of the heat treatment space 65, the quartz window 64 and the infrared-transparent window 63 are sealed to the chamber 6 with O-rings (not shown), thereby preventing inflow and outflow of any gas through a gap therebetween. To be specific, the O-ring is interposed between the chamber 6 and a peripheral portion of an upper surface of the quartz window 64, and a clamp ring 66 in abutment with a peripheral portion of a lower surface of the quartz window 64 is, screwed to the chamber 6, thereby pressing the quartz window 64 to the O-ring. In the same manner, the O-ring is interposed between the chamber 6 and a peripheral portion of a lower surface of the infrared-transparent window 63, and a clamp ring 62 in abutment with a peripheral portion of an upper surface of the infrared-transparent window 63 is screwed to the chamber 6, thereby pressing the infrared-transparent window 63 to the O-ring.

The side wall of the chamber 6 has a transport opening 67 through which the semiconductor wafer W is transported in and out. The transport opening 67 is openable and closable by means of a gate valve (not shown). When the transport opening 67 is opened, a transport robot outside the apparatus is allowed to transport the semiconductor wafer W into and out of the chamber 6. When the transport opening 67 is closed, the heat treatment space 65 is an enclosed space so that the ventilation between the heat treatment space 65 and the outside is blocked.

The holder 7 provided and fixed within the chamber 6 includes a holding plate 71 and support pins 72. The entire holder 7 including the holding plate 71 and the support pins 72 is made of quartz. The holding plate 71 is provided and fixed with a horizontal attitude within the chamber 6. On an upper surface of the holding plate 71, a plurality of support pins 72 (at least three support pins 72) are arranged in a standing manner. The plurality of support pins 72 defines a circle whose diameter is slightly smaller than the diameter of the semiconductor wafer W. Accordingly, the plurality of support pins 72 can place and support the semiconductor wafer W thereon with a horizontal attitude (the attitude in which the normal of the semiconductor wafer W extends in the vertical direction). Instead of the plurality of support pins 72, a quartz ring having a diameter smaller than that of the semiconductor wafer W may be arranged on the upper surface of the holding plate 71.

A transfer mechanism 5 is provided within the chamber 6. The transfer mechanism 5 includes a pair of transfer arms 51 and lift pins 52 each arranged on an upper surface of each of the transfer arms 51. For example, two lift pins 52 are arranged on each of the two transfer arms 51. All the two transfer arms 51 and the four lift pins 52 are made of quartz. The pair of transfer arms 51 are moved up and down along the vertical direction by an elevation driver (not shown). When the pair of transfer arms 51 are moved up, the four lift pins 52 in total pass through through holes provided in the holding plate 71. Thus, the upper ends of the four lift pins 52 protrude beyond the upper surface of the holding plate 71, and reach a position above the support pins 72. On the other hand, when the transfer arms 51 are moved down, the upper ends of the lift pins 52 are located below the holding plate 71, as shown in FIG. 1. It may be acceptable that an open/close mechanism horizontally opens and closes the pair of transfer arms 51 while the transfer arms 51 are moved down.

Figure 2:
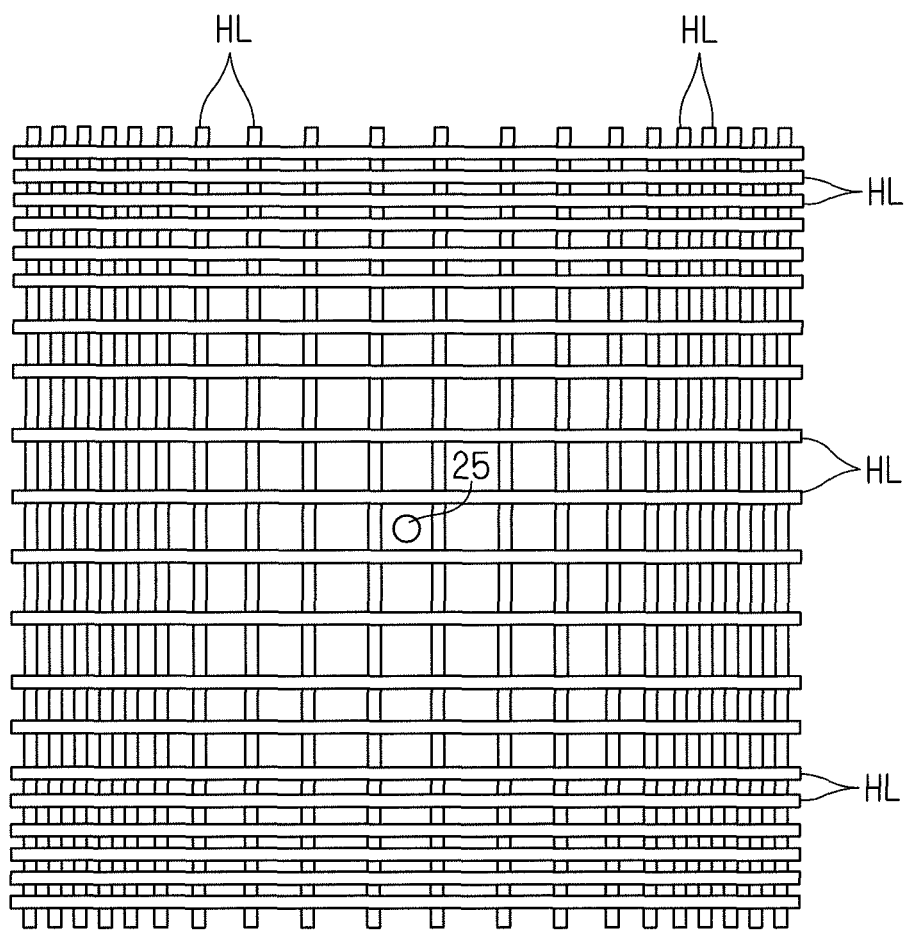
FIG. 2 is a plan view showing an arrangement of a plurality of halogen lamps.

The light irradiation part 4 is provided below the chamber 6. The light irradiation part 4 includes a plurality of halogen lamps HL and a reflector 43. In this preferred embodiment, the light irradiation part 4 includes forty halogen lamps HL. The plurality of halogen lamps HL radiates light from the lower side of the chamber 6 through the quartz window 64 into the heat treatment space 65. FIG. 2 is a plan view showing an arrangement of the plurality of halogen lamps HL. In this preferred embodiment, the halogen lamps HL are arranged in upper and lower two stages, and each of the stages includes twenty halogen lamps HL. Each of the halogen lamps HL is a rod-like lamp having an elongated cylindrical shape. In both of the upper stage and the lower stage, the twenty halogen lamps HL are arranged in parallel to one another with the with the longitudinal direction thereof extending along a main surface of the semiconductor wafer W held on the holder 7 (that is, along the horizontal direction). Accordingly, in both of the upper stage and the lower stage, a plane defined by the arrangement of the halogen lamps HL is a horizontal plane.

As shown in FIG. 2, in both of the upper stage and the lower stage, the halogen lamps HL are arranged at a higher density in a region opposed to a peripheral portion of the semiconductor wafer W held on the holder 7, than in a region opposed to a central portion of the semiconductor wafer W. In other words, in both of the upper stage and the lower stage, the pitch of arrangement of the halogen lamps HL is shorter in an end portion than in a central portion. Therefore, the peripheral portion of the semiconductor wafer W, in which a temperature drop is likely to occur during the heating by light irradiation from the light irradiation part 4, can be irradiated with a larger amount of light.

A group of halogen lamps HL in the upper stage and a group of halogen lamps HL in the lower stage cross each other in a grid pattern. That is, the forty halogen lamps HL in total are arranged with the longitudinal direction of each halogen lamp HL in the upper stage and the longitudinal direction of each halogen lamp HL in the lower stage extending perpendicularly to each other.

The halogen lamp HL is a filament type light source in which a filament arranged within a glass tube is electrically conducted and thereby caused to glow so that light is emitted. A gas obtained by introducing a very small amount of a halogen element (such as iodine or bromine) into an inert gas such as a nitrogen gas or an argon gas is sealed within the glass tube. The introduction of the halogen element enables the temperature of the filament to be set to a high temperature while suppressing a break damage to the filament. Accordingly, the halogen lamp HL has a feature that it has a longer lifetime than a normal incandescent lamp and can continuously emit light with high intensity. Additionally, the halogen lamp HL has a long lifetime because it is a rod-like lamp, and arranging the halogen lamp HL along the horizontal direction achieves an excellent efficiency of irradiation of the semiconductor wafer W.

The reflector 43 is provided below the plurality of halogen lamps HL so as to cover the whole of them. A basic function of the reflector 43 is to reflect light emitted from the plurality of halogen lamps HL toward the heat treatment space 65 within the chamber 6. For example, the reflector 43 is formed of an aluminum alloy plate, with a surface thereof (the surface facing the halogen lamps HL) being roughened through a blast process.

The temperature correction part 2 is also provided below the chamber 6. FIG. 3 is a diagram showing a configuration of the temperature correction part 2. In FIG. 3, for the convenience of illustration, the configurations of the light irradiation part 4 and the chamber 6 are simplified. The temperature correction part 2 includes a laser unit 21, a laser light emission part 25, and a rotation motor 24. In this preferred embodiment, the laser unit 21 is a semiconductor laser having an extremely high output of 500 W, and emits a visible light laser having a wavelength of 800 nm to 820 nm. The laser light emitted from the laser unit 21 is guided through an optical fiber 22 to a collimator lens 23. The collimator lens 23 emits a parallel laser light, which is then incident on the laser light emission part 25.

Figure 4:
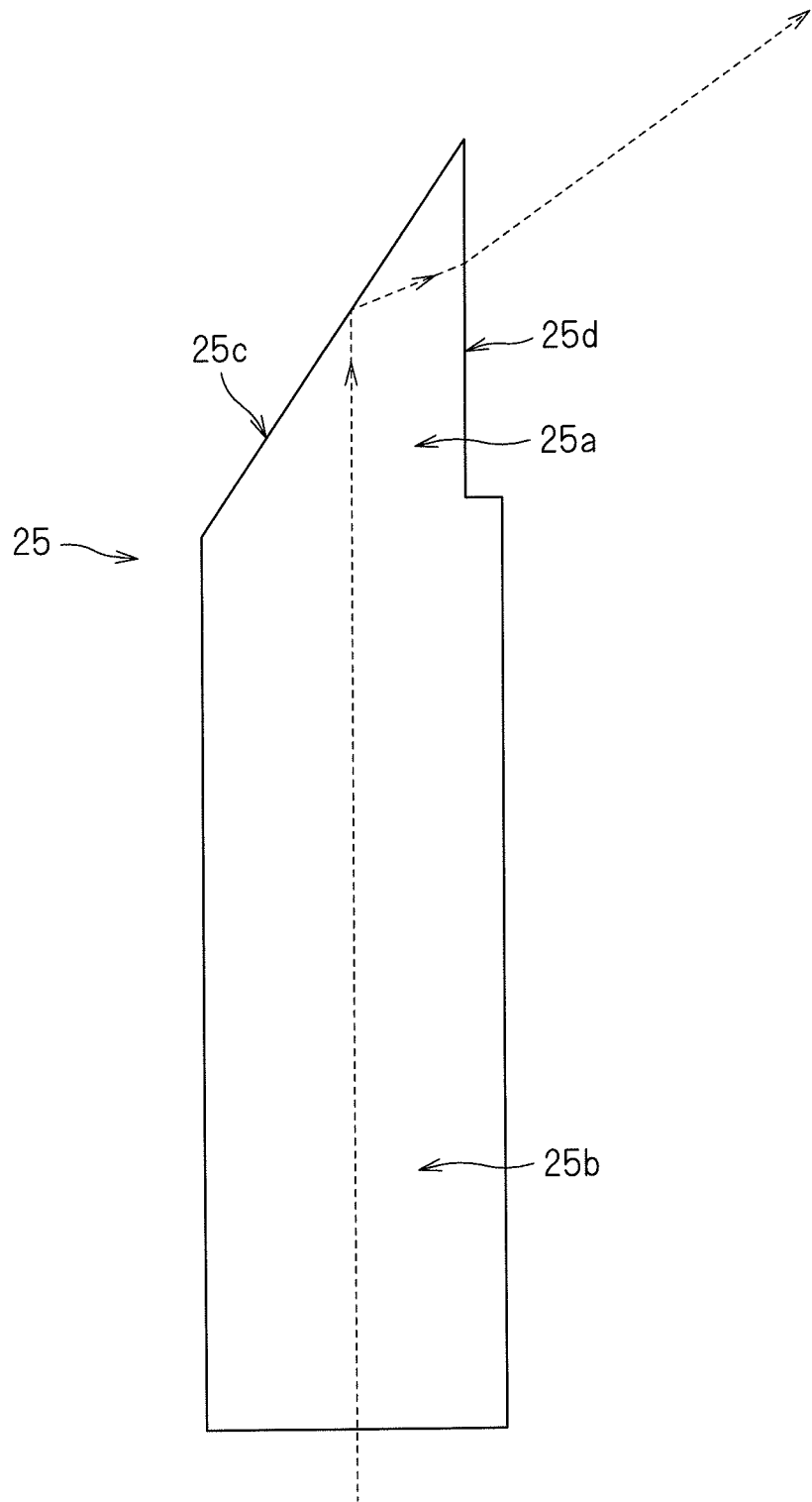
FIG. 4 is a longitudinal cross-sectional view of a laser light emission part.

FIG. 4 is a longitudinal cross-sectional view of the laser light emission part 25. The laser light emission part 25 is an optical member made of quartz and having a substantially rod-like shape. The laser light emission part 25 includes a light projector 25a arranged at the upper end thereof, and a light guide 25b provided below the light projector 25a so as to extend along the vertical direction. The light guide 25b has a column-like shape and, in this preferred embodiment, the diameter thereof is φ15 mm. The light projector 25a has a reflection surface 25c and an emission surface 25d. In this preferred embodiment, the emission surface 25d extends along the vertical direction, and the angle formed between the reflection surface 25c and a horizontal plane is set to be, for example, 56.7°. The laser light emission part 25 may be prepared by cutting out the reflection surface 25c and the emission surface 25d from a single column-shaped quartz rod, or by bonding the light projector 25a and the light guide 25b, configured as separate quartz members, to each other.

The laser light emission part 25 is arranged immediately below the center of the semiconductor wafer W held on the holder 7 such that the laser light emission part 25 extends along a central axis CX of the semiconductor wafer W. Specifically, the laser light emission part 25 is arranged such that the central axis CX (FIG. 3) extending vertically through the center of the semiconductor wafer W held with the horizontal attitude on the holder 7 is coincident with a central axis of the light guide 25b having a column-like shape.

As shown in FIG. 3, by a rotation motor 24, the laser light emission part 25 is rotatable about, as the center of rotation, the central axis of the light guide 25b (that is, the central axis CX of the semiconductor wafer W). In this preferred embodiment, the rotation motor 24 is a hollow motor whose motor shaft is hollow, and the lower end of the light guide 25b extends through this hollow portion. The collimator lens 23 is arranged at a position opposed to a lower end surface of the light guide 25b. An encoder 24a is attached to the rotation motor 24. The encoder 24a is configured to detect the angle of rotation of the laser light emission part 25.

The laser light emission part 25 is able to be reciprocated along the central axis CX of the semiconductor wafer W by a sliding driver 26. For example, the sliding driver 26 may be a pulse motor that rotates a ball screw threadably fitted to a member that is coupled to the light guide 25b. An encoder 26a is attached to the sliding driver 26. The encoder 26a is configured to detect the height position of the laser light emission part 25.

An upper end portion of the light guide 25b extends through the reflector 43 of the light irradiation part 4. It may be possible to arrange a bearing at a location where the light guide 25b passes through the reflector 43. The light guide 25b extends through a gap of the arrangement of the halogen lamps HL (see FIG. 2), so that the upper end of the light guide 25b is positioned above at least the halogen lamps HL in the upper stage. The light projector 25a is continuous with the upper end of the light guide 25b. Accordingly, even when the laser light emission part 25 is rotated, contact between the laser light emission part 25 and the halogen lamps HL is prevented.

As shown in FIG. 4, the laser light, which is emitted from the laser unit 21 and then, through the collimator lens 23, incident perpendicularly on the lower end surface of the light guide 25b of the laser light emission part 25, travels straight along the longitudinal direction of the light guide 25b that is arranged along the vertical direction. That is, the incident laser light is guided in parallel to the central axis of the light guide 25b toward the light projector 25a provided at the upper side. Then, the laser light guided through the light guide 25b is then totally reflected at the reflection surface 25c of the light projector 25a toward the emission surface 25d. Then, the laser light is emitted from the emission surface 25d toward the peripheral portion of the semiconductor wafer W held on the holder 7. When the laser light is emitted into the air from the light projector 25a made of quartz, the laser light is slightly refracted. As a result, the laser light emitted from the laser light emission part 25 forms an angle of about 35° relative to a the horizontal plane. In this preferred embodiment, this angle is set to be about 35°. However, this angle may be set to be appropriate value depending on an arrangement configuration of the heat treatment apparatus 1 (such as the positional relationship between the laser light emission part 25 and the semiconductor wafer W). More specifically, this angle can be adjusted based on the angle formed between the reflection surface 25c and a horizontal plane.

The laser light emitted from the laser light emission part 25 is radiated to a partial region of a peripheral portion of the back surface of the semiconductor wafer W. While the laser light emission part 25 is emitting the laser light, the rotation motor 24 rotates the laser light emission part 25 about the central axis CX as the center of rotation. Thereby, a spot irradiated with the laser light circles along the peripheral portion of the back surface of the semiconductor wafer W. When the sliding driver 26 moves up or down the laser light emission part 25 along the central axis CX, the diameter of a circle along which the spot irradiated with the laser light is increased or decreased. The irradiation of the peripheral portion of the semiconductor wafer W with the laser light emitted from the temperature correction part 2 will be further described later.

Referring to FIG. 1 again, the temperature detection part 8 is provided above the chamber 6. In the first preferred embodiment, the temperature detection part 8 includes an infrared camera 81. The infrared camera 81 detects and images a so-called middle infrared ray having a wavelength of 3.7 μm to 4.8 μm. The infrared camera 81 is arranged above the chamber 6 with an image lens of the infrared camera 81 being opposed to the infrared-transparent window 63. The infrared-transparent window 63 made of silicon allows an infrared ray having a wavelength of 1 μm or more to transmit therethrough. That is, an infrared ray having a wavelength of 3.7 μm to 4.8 μm emitted from the heat treatment space 65 within the chamber 6 transmits through the infrared-transparent window 63, to be detected by the infrared camera 81. Thus, the infrared camera 81 can image the heat treatment space 65 located below the infrared-transparent window 63.

The infrared camera 81 is positioned at such a height that the entire surface of the semiconductor wafer W held on the holder 7 is included in the viewing field of the infrared camera 81. Accordingly, the infrared camera 81 can image the entire surface of the semiconductor wafer W held on the holder 7 through the infrared-transparent window 63. In order to prevent the infrared camera 81 from detecting an infrared ray emitted from the infrared-transparent window 63, the distance between the infrared camera 81 and the infrared-transparent window 63 is set to be a value equal to or smaller than half the depth of field which means a range where the infrared camera 81 focuses on the semiconductor wafer W as an object. For example, in a case of providing the infrared camera 81 in which the shortest distance of the depth of field is 30 cm, the infrared camera 81 is set such that the distance to the infrared-transparent window 63 is in the range from 0 cm to 15 cm. Preferably, the distance between the infrared camera 81 and the infrared-transparent window 63 is set as short as possible.

A cooling part 69 for cooling the infrared-transparent window 63 is provided in the heat treatment apparatus 1. In the first preferred embodiment, a blower is adopted as the cooling part 69. The cooling part 69 is provided outside the chamber 6, and blows air toward the upper surface of the infrared-transparent window 63 to thereby cool the infrared-transparent window 63 with air. The cooling part 69 may include a temperature control mechanism for controlling the temperature of blowing air.

The controller 3 controls the above-described various operation mechanisms provided in the heat treatment apparatus 1. A hardware configuration of the controller 3 is identical to that of an ordinary computer. More specifically, the controller 3 includes a CPU for performing various types of computation, a ROM which is a read only memory storing a basic program, a RAM which is a random access memory storing various types of information, and a magnetic disk storing control software, data, and the like. The CPU of the controller 3 executes a predetermined processing program, and thereby a process proceeds in the heat treatment apparatus 1. A result of imaging obtained by the infrared camera 81 is sent to the controller 3. The controller 3 controls the light irradiation part 4 and the temperature correction part 2, too.

The heat treatment apparatus 1 may include, in addition to the above-described configuration, a mechanism for adjusting an atmosphere of the heat treatment space 65, a gas supply mechanism for supplying a process gas such as a nitrogen ($N_2$) gas, an oxygen ($O_2$) gas, a hydrogen ($H_2$) gas, a hydrogen chloride (HCl) gas, or an ammonia ($NH_3$) gas to the heat treatment space 65, and an exhaust mechanism for discharging an atmosphere of the heat treatment space 65 to the outside of the apparatus. Additionally, a water-cooling tube for preventing an excessive temperature rise in the chamber 6, which may be caused by light irradiation from the light irradiation part 4, may be provided to the side wall of the chamber 6.

Next, a description will be given to process steps performed on the semiconductor wafer W by the heat treatment apparatus 1. The process steps performed by the heat treatment apparatus 1, which will be described below, are proceeded along with the controller 3 controlling the operation mechanisms of the heat treatment apparatus 1.

Firstly, the gate valve (not shown) is opened so that the transport opening 67 is opened. The transport robot provided outside the apparatus transports a silicon semiconductor wafer W that is a processing object into the chamber 6 through the transport opening 67. The semiconductor wafer W transported into the chamber 6 by the transport robot is moved to a position immediately above the holder 7 and then stopped. Then, the pair of transfer arms 51 of the transfer mechanism 5 move up. This causes the four lift pins 52 in total to pass through the through holes of the holding plate 71 and protrude up beyond the support pins 72, thus receiving the semiconductor wafer W from the transport robot.

After the semiconductor wafer W is placed on the lift pins 52, the transport robot exits the heat treatment space 65 and the transport opening 67 is closed. Thereby, the heat treatment space 65 becomes an enclosed space. Then, the pair of transfer arms 51 move down, so that the semiconductor wafer W is transferred from the transfer mechanism 5 to the holder 7, and held from underneath with a horizontal attitude by the support pins 72. The semiconductor wafer W is held on the holder 7 with its front surface having a pattern formed thereon serving as an upper surface. That is, the back surface having no pattern formed thereon serves as a lower surface.

After the semiconductor wafer W is held from underneath with the horizontal attitude by the holder 7 made of quartz, the forty halogen lamps HL of the light irradiation part 4 are concurrently turned on, thus starting light irradiation heating (lamp annealing). Halogen light emitted from the halogen lamps HL transmits through the quartz window 64 and the holding plate 71 made of quartz, and the semiconductor wafer W is irradiated from the back surface thereof.

FIG. 5 is a diagram showing a spectral transmittance of quartz. As shown in FIG. 5, quartz allows light having a relatively short wavelength of 2.5 μm or less to mostly transmit therethrough, while its transmittance considerably drops with respect to light having a wavelength of longer than 2.5 μm, that is, longer than the wavelength of the so-called middle infrared ray. An infrared ray having a wavelength of 3.7 μm to 4.8 μm, which is a wavelength region detectable by the infrared camera 81 hardly transmits through quartz. Accordingly, although the infrared camera 81 can image the heat treatment space 65 located below the infrared-transparent window 63, the infrared camera 81 cannot detect light emitted from the halogen lamps HL that are located below the quartz window 64. This means that light emitted from the halogen lamps HL does not cause ambient light for the infrared camera 81.

Light emitted from the halogen lamps HL and transmitting through the quartz window 64 and the holding plate 71 made of quartz is then radiated to the back surface of the semiconductor wafer W held on the holder 7. Thereby, the semiconductor wafer W is heated, and its temperature is raised to the processing temperature that is a target temperature. In this preferred embodiment, the semiconductor wafer W is irradiated with light from the back surface thereof on which no pattern is formed. This enables the light irradiation heating to be uniformly performed (so-called back side annealing). To be specific, in the back surface of the semiconductor wafer W on which no pattern is formed, there is no pattern dependency of the light absorption rate, and therefore the light absorption rate is uniform throughout the entire back surface. As a result, light emitted from the halogen lamps HL is uniformly absorbed. Since the transfer arms 51 and the lift pins 52 of the transfer mechanism 5 are also made of quartz, they do not hinder the light irradiation heating performed by the halogen lamps HL.

The semiconductor wafer W whose temperature has been raised by the light irradiation heating performed by the halogen lamps HL emits an infrared ray having a intensity (energy) in accordance with the temperature thereof. It is known that the intensity of the infrared ray emitted from the semiconductor wafer W is proportional to the fourth power of the temperature (absolute temperature) (Stefan-Boltzmann law). The infrared ray emitted from the front surface of the semiconductor wafer W whose temperature has been raised transmits through the silicon infrared-transparent window 63 arranged at the upper end of the chamber 6.

FIG. 6 is a diagram showing a spectral transmittance of silicon having a thickness of 3 mm. As shown in FIG. 6, none of light having a wavelength of 1 μm or less, including visible light, is allowed to transmit therethrough silicon, while some of an infrared ray having a wavelength of more than 1 μm is allowed to transmit through silicon. An infrared ray having a wavelength of 3.7 μm to 4.8 μm, which is a wavelength region detectable by the infrared camera 81 is also allowed to transmit through silicon. Therefore, an infrared ray having a wavelength of 3.7 μm to 4.8 μm emitted from the front surface of the semiconductor wafer W whose temperature has been raised transmits through the infrared-transparent window 63 made of silicon, and then is detected by the infrared camera 81.

At this time, part of light emitted from the semiconductor wafer W transmits through the infrared-transparent window 63, but the rest of the light is absorbed by the infrared-transparent window 63 so that the infrared-transparent window 63 itself is heated. That is, radiation heat generated from the semiconductor wafer W whose temperature has been raised by the light irradiation heating heats the infrared-transparent window 63 made of the same material (silicon) as that of the semiconductor wafer W. Silicon has such properties that it exhibits the spectral transmittance characteristics as shown in FIG. 6 at room temperature, while it hardly allows an infrared ray to transmit therethrough when it is heated and the temperature thereof is raised. Accordingly, as more time elapses since the temperature of the semiconductor wafer W is raised, the temperature of the infrared-transparent window 63 is also raised to make it less likely that an infrared ray emitted from the semiconductor wafer W transmits through the infrared-transparent window 63, thus making it difficult that the infrared camera 81 detects the infrared ray.

For this reason, the cooling part 69 for cooling the infrared-transparent window 63 is provided. While at least the halogen lamps HL are turned on, the cooling part 69 continuously blows air toward the upper surface of the infrared-transparent window 63. Therefore, even when the temperature of the semiconductor wafer W is raised by the light irradiation heating performed by the halogen lamps HL, the temperature of the infrared-transparent window 63 is kept at 150° C. or less by means of the cooling part 69. When the temperature of the infrared-transparent window 63 is 150° C. or less, the infrared-transparent window 63 allows an infrared ray having a wavelength of 3.7 μm to 4.8 μm to transmit therethrough. In order to more surely transmit the infrared ray therethrough, it is preferable that the infrared-transparent window 63 is cooled to 100° C. or less by means of the cooling part 69.

Even if the temperature of the infrared-transparent window 63 is slightly raised by the radiation heat generated from the semiconductor wafer W, the infrared camera 81 does not detect an infrared ray emitted from the infrared-transparent window 63, because the distance between the infrared camera 81 and the infrared-transparent window 63 is set to be a value equal to or smaller than half the shortest distance of the depth of field in a case of focusing on the semiconductor wafer W as an object. Therefore, the infrared camera 81 can surely detect the infrared ray emitted from the front surface of the semiconductor wafer W without detecting the infrared ray emitted from the infrared-transparent window 63.

Figure 7:
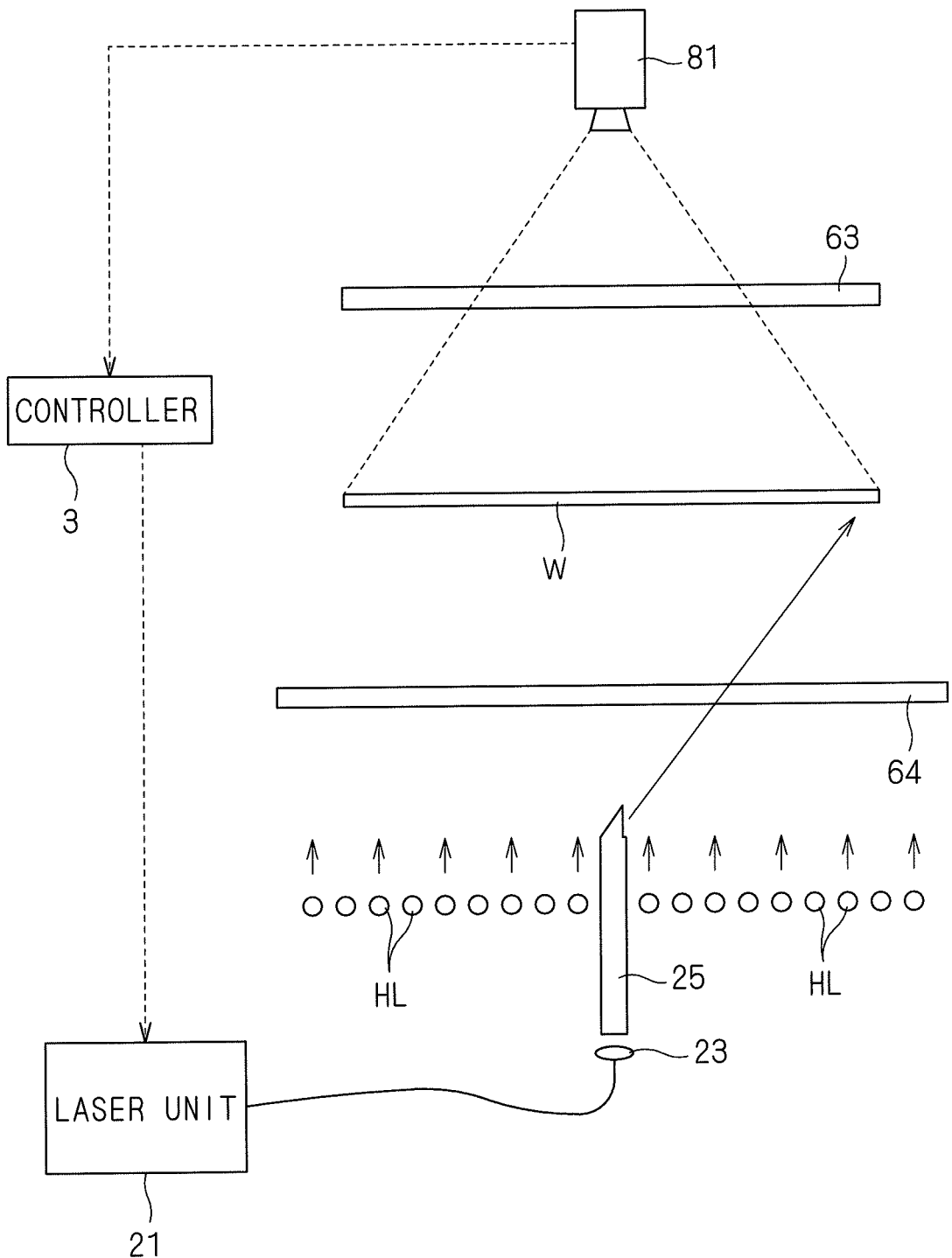
FIG. 7 is a diagram conceptually showing a situation where the temperature of a semiconductor wafer is corrected based on a result of detection obtained by an infrared camera.

FIG. 7 is a diagram conceptually showing a situation where the temperature of the semiconductor wafer W is corrected based on a result of detection obtained by the infrared camera 81. As described above, light emitted from the halogen lamps HL transmits through the quartz window 64 and the quartz holding plate 71 (not shown in FIG. 7), and then is radiated to the back surface of the semiconductor wafer W. As a result, the semiconductor wafer W is heated, so that the temperature thereof is raised to the processing temperature. The semiconductor wafer W whose temperature has been raised emits an infrared ray having an intensity in accordance with the temperature thereof. Part of the infrared ray emitted from the front surface of the semiconductor wafer W transmits through the infrared-transparent window 63 made of silicon. Among the infrared rays having transmitted through the infrared-transparent window 63, an infrared ray having a wavelength of 3.7 μm to 4.8 μm is detected by the infrared camera 81 at predetermined cycles. Based on the intensity of the infrared ray detected by the infrared camera 81, the temperature of the semiconductor wafer W can be measured.

The infrared camera 81 is positioned at such a height that it can image, through the infrared-transparent window 63, the entire surface of the semiconductor wafer W held on the holder 7. Accordingly, the infrared camera 81 is capable of two-dimensional detection of the temperature of the entire front surface of the semiconductor wafer W subjected to the light irradiation heating performed by the halogen lamps HL. The temperature of the entire front surface of the semiconductor wafer W detected by the infrared camera 81 is sent to the controller 3. The controller 3 prepares a temperature map of the semiconductor wafer W based on a result of detection obtained by the infrared camera 81. At this time, as necessary, a shading correction or the like may be performed.

FIG. 8 is a diagram showing an example of the temperature map of the semiconductor wafer W prepared based on a result of detection obtained by the infrared camera 81. In this example, as shown in FIG. 8, a temperature drop region (cold spot) CP having a relatively low temperature as compared with the other regions locally appears in a part of the peripheral portion of the semiconductor wafer W. Such a cold spot CP is caused by, for example, contact made between the semiconductor wafer W and the support pins 72 or an air stream produced within the chamber 6. The cold spot CP emits an infrared ray having a lower intensity, because its temperature is lower as compared with the other regions of the semiconductor wafer W. This difference in the intensity is detected by the infrared camera 81.

The controller 3 controls the temperature correction part 2 so as to selectively heat the cold spot CP based on the result of detection obtained by the infrared camera 81 (the temperature map as shown in FIG. 8). In the temperature correction part 2, a laser light emitted from the laser unit 21 is, through the collimator lens 23, incident on the light guide 25*b* of the laser light emission part 25. The incident laser light is emitted from the light projector 25*a* of the laser light emission part 25, through the quartz window 64, to the peripheral portion of the back surface of the semiconductor wafer W held on the holder 7. At this time, the rotation motor 24 rotates the laser light emission part 25 about, as the center of rotation, the central axis CX of the semiconductor wafer W. This causes a spot irradiated with the laser light emitted from the laser light emission part 25 to circle along the peripheral portion of the back surface of the semiconductor wafer W. It may be also possible that the sliding driver 26 moves up and down the laser light emission part 25 along the central axis CX. This causes the spot irradiated with the laser light to circle while following a winding course, thus enlarging the width of irradiation with the laser light in the peripheral portion of the back surface of the semiconductor wafer W.

As shown in FIG. 8, in a case where the cold spot CP appears in a part of the peripheral portion of the semiconductor wafer W, under control by the controller 3 based on the result of detection obtained by the infrared camera 81, the laser unit 21 modulates a laser light output. FIG. 9 is a diagram for explaining the modulation of the laser light output. In FIG. 9, the horizontal axis represents the angle of rotation of the laser light emission part 25. The denotations of "$2\pi$" and "$4\pi$" are the angles of rotation at a time when the laser light emission part 25 is rotated once and twice, respectively. The angle of rotation of the laser light emission part 25 is measured by the encoder 24*a* and sent to the controller 3. In FIG. 9, the vertical axis represents the laser light output of the laser unit 21. As shown in FIG. 9, when the angle of rotation of the laser light emission part 25 is such an angle that the spot irradiated with the laser light is positioned at the cold spot CP, the laser light output of the laser unit 21 is increased under control by the controller 3. When the spot irradiated with the laser light is not positioned at the cold spot CP, the laser light output of the laser unit 21 is reduced. Here, the laser unit 21 can control the laser light output within a range from 0% to 100% at a high speed.

In this manner, only the cold spot CP having a relatively low temperature, which appears in the peripheral portion of the semiconductor wafer W as a result of the light irradiation heating performed by the halogen lamps HL, to be irradiated with an intensive laser light emitted from the laser light emission part 25, and thus to be heated. This can remove the cold spot CP, and can uniformly heat the entire surface of the semiconductor wafer W up to the processing temperature.

After the light irradiation heating is completed, the halogen lamps HL are turned off, so that the temperature of the semiconductor wafer W starts to drop. At this time, the temperature correction part 2 may continue to irradiate the peripheral portion of the back surface of the semiconductor wafer W with the laser light. Normally, when the temperature of the semiconductor wafer W is dropping after the halogen lamps HL are turned off, there is a tendency that the temperature of the peripheral portion drops earlier to thereby cause non-uniformity in the temperature distribution. By irradiating the peripheral portion of the back surface of the semiconductor wafer W with the laser light emitted from the temperature correction part 2 even when the temperature of the semiconductor wafer W is dropping, the peripheral portion whose temperature drops earlier can be selectively heated. As a result, the uniformity in the temperature distribution in a plane can be maintained even when a temperature drop occurs.

After a predetermined time period elapses since the halogen lamps HL are turned off so that the temperature of the semiconductor wafer W sufficiently drops, the pair of transfer arms 51 of the transfer mechanism 5 move up. Thus, the lift pins 52 thrust up the semiconductor wafer W held on the holding plate 71, so that the semiconductor wafer W is spaced apart from the support pins 72. Then, the transport opening 67 is opened again, and a hand of the transport robot provided outside the apparatus enters the chamber 6 through the transport opening 67, and stops at a position immediately below the semiconductor wafer W. Then, the transfer arms 51 move down, so that the semiconductor wafer W is transferred from the lift pins 52 to the transport robot. Then, the hand of the transport robot having received the semiconductor wafer W exits the chamber 6. Thereby, the semiconductor wafer W is transported out from the chamber 6. Thus, the light irradiation heating treatment in the heat treatment apparatus 1 is completed.

In the first preferred embodiment, the non-uniformity in the temperature distribution in a plane of the semiconductor wafer W, which has been caused by the light irradiation heating performed by the halogen lamps HL, is detected by the infrared camera 81. The wavelength region detectable by the infrared camera 81 is 3.7 µm to 4.8 µm. Among the light emitted from the halogen lamps HL, light included in this wavelength region is mostly cut by the quartz window 64 arranged at the lower end of the chamber 6. Accordingly, the light emitted from the halogen lamps HL does not reach the infrared camera 81, and there is no risk that the light emitted from the halogen lamps HL creates ambient light at a time of the temperature detection. On the other hand, the infrared-transparent window 63 made of silicon and arranged at the upper end of the chamber 6 allows, among the light emitted from the semiconductor wafer W whose temperature has been raised, an infrared ray included in the wavelength region from 3.7 µm to 4.8 µm which is detectable by the infrared camera 81 to transmit therethrough. This enables the infrared camera 81 to surely detect the temperature of the semiconductor wafer W. The infrared camera 81 is also capable of two-dimensional detection of the temperature of the entire front surface of the semiconductor wafer W held on the holder 7.

Additionally, based on the result of detection obtained by the infrared camera 81, the controller 3 controls the temperature correction part 2 so as to heat the cold spot CP having a relatively low temperature among the region of the semiconductor wafer W. More specifically, the output of the laser light radiated from the laser light emission part 25 of the temperature correction part 2 to the cold spot CP is increased by means of the laser modulation. This achieves a uniform temperature distribution throughout the entire surface of the semiconductor wafer W.

In this manner, without rotating the semiconductor wafer W, the temperature of the entire surface of the semiconductor wafer W can be two-dimensionally detected, and the temperature is corrected based on a result of the detection to thereby achieve a uniform temperature distribution throughout the entire surface of the semiconductor wafer W. Since it is not necessary to rotate the semiconductor wafer W, any rotation mechanism is not required within the chamber 6. Thus, the configuration of the heat treatment apparatus 1 is simplified, and the volume of the chamber 6 can be reduced. Moreover, since there is no rotation mechanism provided within the chamber 6, generation of particles from a rotation mechanism, which may contaminate the heat treatment space 65, is prevented.

Furthermore, since it is not necessary to rotate the semiconductor wafer W, the halogen lamps HL can start the light irradiation heating immediately after the semiconductor wafer W is transported into the chamber 6. This can enhance the throughput of the heat treatment apparatus 1.

Furthermore, since the temperature of the entire surface of the semiconductor wafer W is two-dimensionally detected to prepare the temperature map, even local non-uniformity in the temperature distribution can also be detected, and the temperature correction can be performed at this location. This enables the temperature distribution in the entire surface of the semiconductor wafer W to be made uniform with a high accuracy.

In a temperature correction method in which the laser light emission part 25 is rotated to cause the spot irradiated with the laser light to circle along the peripheral portion of the back surface of the semiconductor wafer W, the temperature in the vicinity of a central portion of the semiconductor wafer W cannot be corrected even if the laser light emission part 25 is moved up and down by the sliding driver 26. However, in a case where the semiconductor wafer W is placed on the support pins 72 arranged on the holding plate 71 and subjected to the light irradiation heating by the halogen lamps HL as described in this preferred embodiment, the uniformity in the temperature in the vicinity of the central portion of the semiconductor wafer W is normally kept relatively good. In most cases, the cold spot CP having a relatively low temperature appears in the peripheral portion of the semiconductor wafer W. Therefore, the temperature distribution in the entire surface of the semiconductor wafer W can be made uniform, as long as the laser light emission part 25 can be rotated and the temperature correction can be performed in the peripheral portion of the semiconductor wafer W located in the outer half of the radius of the semiconductor wafer W.

Even in a case of performing the back side annealing in which the semiconductor wafer W is irradiated with light from the back surface thereof as described in this preferred embodiment, the semiconductor wafer W can be held on the holder 7 having a simple configuration in which merely the support pins 72 are arranged on the holding plate 71 made of quartz. Although it is conceivable that a contact portion between the semiconductor wafer W and the support pin 72 has a relatively low temperature because of heat conduction, such a portion is also correctly detected by the infrared camera 81 and easily removed by irradiation with the laser light from the temperature correction part 2.

In the heat treatment apparatus 1 according to this preferred embodiment, the light irradiation heating is performed on the semiconductor wafer W being placed on the support pins 72. Instead, the light irradiation heating may be performed on the semiconductor wafer W being held on the lift pins 52 of the transfer mechanism 5. In this case, the pair of transfer arms 51 are moved down to cause the semiconductor wafer W to land on the holding plate 71 at a time when the light irradiation heating is completed. Thereby, the temperature of the semiconductor wafer W can be rapidly dropped (rapid cooling). This can considerably reduce the operational costs of the apparatus, as compared with the conventional rapid cooling with use of a helium (He) gas or the like.

Second Preferred Embodiment

Figure 10:
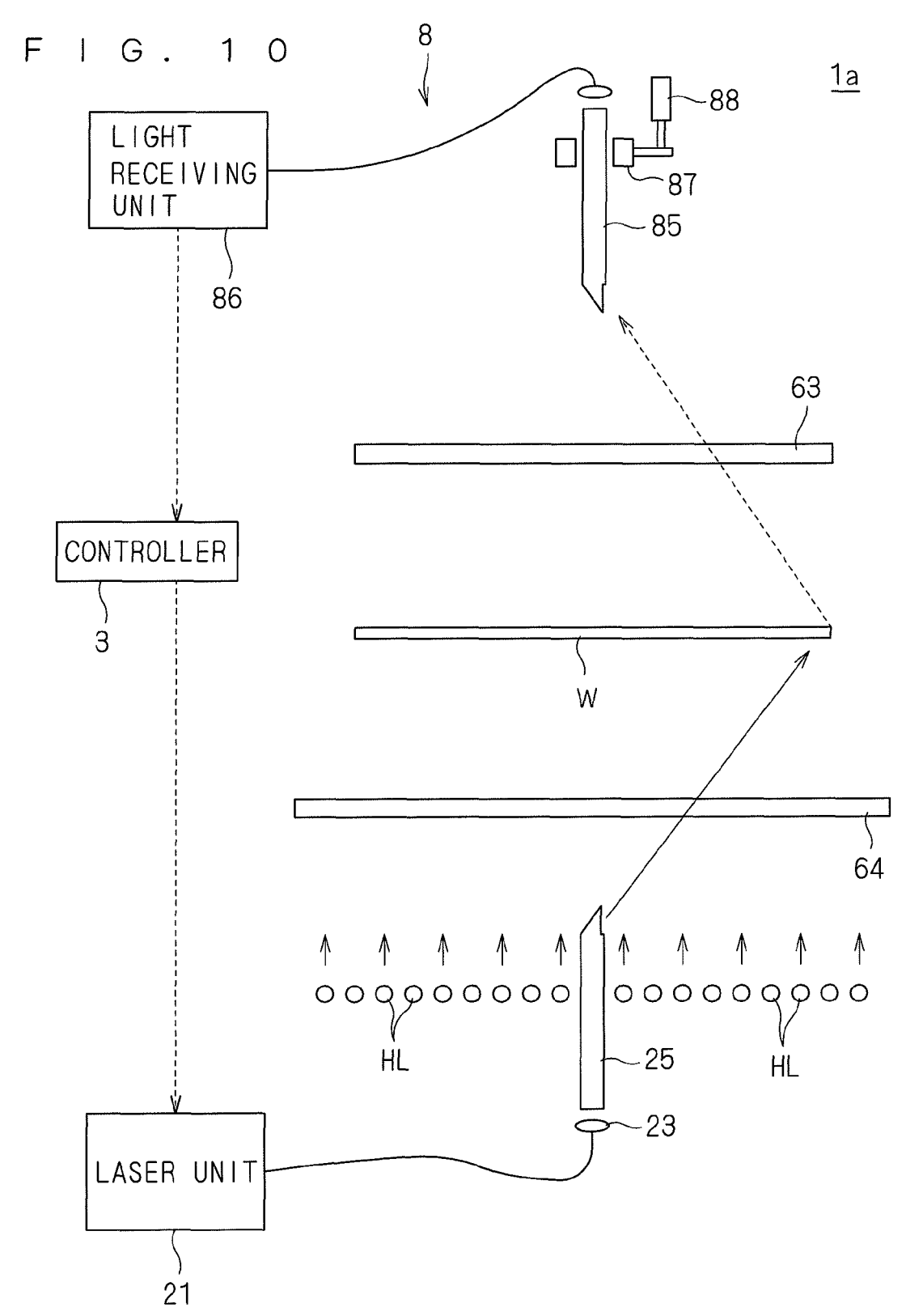

Next, a second preferred embodiment of the present invention will be described. FIG. 10 is a diagram conceptually showing a situation of a temperature correction in a heat treatment apparatus 1a according to the second preferred embodiment. In FIG. 10, the same parts as those of the first preferred embodiment are denoted by the same corresponding reference numerals. The heat treatment apparatus 1a according to the second preferred embodiment is the same as the heat treatment apparatus 1 according to the first preferred embodiment, except for the configuration of the temperature detection part 8.

In the second preferred embodiment, the temperature detection part 8 includes a laser light receiving part 85 and a light receiving unit 86. The laser light receiving part 85 is a rod-shaped optical member made of quartz, which is identical to the laser light emission part 25. The laser light receiving part 85 is the laser light emission part 25 being placed upside down. A rotation motor 87 attached to the laser light receiving part 85 is identical to the rotation motor 24 attached to the laser light emission part 25. A sliding driver 88 attached to the laser light receiving part 85 is identical to the sliding driver 26 attached to the laser light emission part 25. Parts identical to the encoders 24a and 26a are also provided, though not shown in FIG. 10. In short, the laser light receiving part 85 is the laser light emission part 25 of the temperature correction part 2 and the parts attached thereto being upside down and placed above the chamber 6.

The light receiving unit 86 measures the intensity of an infrared ray received by the laser light receiving part 85, and sends a measurement result in the form of an electrical signal to the controller 3. Thus, the infrared ray received by the laser light receiving part 85 is guided to the light receiving unit 86 through a collimator lens and an optical fiber that are similar to those of the temperature correction part 2. The light receiving unit 86 has a light receiving element such as a photodiode built therein. The light receiving unit 86 converts the intensity of the infrared ray guided from the laser light receiving part 85 into an electrical signal, and sends the electrical signal to the controller 3.

Also in the heat treatment apparatus 1a according to the second preferred embodiment, light emitted from the halogen lamps HL transmits through the quartz window 64 and the holding plate 71 made of quartz, and is radiated to the back surface of the semiconductor wafer W. Thereby, the semiconductor wafer W is heated, and its temperature is raised to the processing temperature that is a target temperature. The semiconductor wafer W whose temperature has been raised emits an infrared ray having an intensity in accordance with the temperature thereof. Part of the infrared ray emitted from the front surface of the semiconductor wafer W transmits through the infrared-transparent window 63 made of silicon.

In the second preferred embodiment, the infrared ray emitted from a specific portion of the front surface of the semiconductor wafer W is received by the laser light receiving part 85. More specifically, the laser light receiving part 85 is arranged at such a position that the laser light receiving part 85 receives the infrared ray emitted from a portion of the front surface corresponding to the position irradiated with the laser light emitted from the laser light emission part 25 of the temperature correction part 2. The laser light receiving part 85 is also rotated by the rotation motor 87 about the central axis CX of the semiconductor wafer W as the center of rotation, such that its rotation is completely synchronized with the rotation of the laser light emission part 25. Additionally, when the laser light emission part 25 is moved up, the laser light receiving part 85 is moved down by the sliding driver 88, while when the laser light emission part 25 is moved down, the laser light receiving part 85 is moved up by the sliding driver 88.

In this manner, the infrared ray emitted from the portion of the front surface of the semiconductor wafer W corresponding to the position on the back surface where the laser light emitted from the laser light emission part 25 reaches is constantly received by the laser light receiving part 85. Thus, the temperature detection part 8 detects the temperature of the position irradiated with the laser light emitted from the laser light emission part 25. Since the laser light emission part 25 is constantly rotated by the rotation motor 24, the laser light receiving part 85 is also rotated by the rotation motor 87 in synchronization with the rotation of the laser light emission part 25. Accordingly, in the second preferred embodiment, the temperature detection part 8 two-dimensionally detects the temperature of the front surface of the semiconductor wafer W held on the holder 7.

In the second preferred embodiment, based on the result of detection obtained by the light receiving unit 86 detecting the infrared ray received by the laser light receiving part 85, the controller 3 controls the temperature correction part 2 so as to heat the cold spot CP having a relatively low temperature among the region of the semiconductor wafer W. More specifically, the output of the laser light radiated from the laser light emission part 25 of the temperature correction part 2 to the cold spot CP is increased by means of the laser modulation. This achieves a uniform temperature distribution throughout the entire surface of the semiconductor wafer W.

Also in the manner described in the second preferred embodiment, the temperature of the entire surface of the semiconductor wafer W can be two-dimensionally detected without rotating the semiconductor wafer W, and the temperature is corrected based on a result of the detection to thereby achieve a uniform temperature distribution throughout the entire surface of the semiconductor wafer W. As a result, the same effects as those of the first preferred embodiment are obtained.

Third Preferred Embodiment

Figure 11:
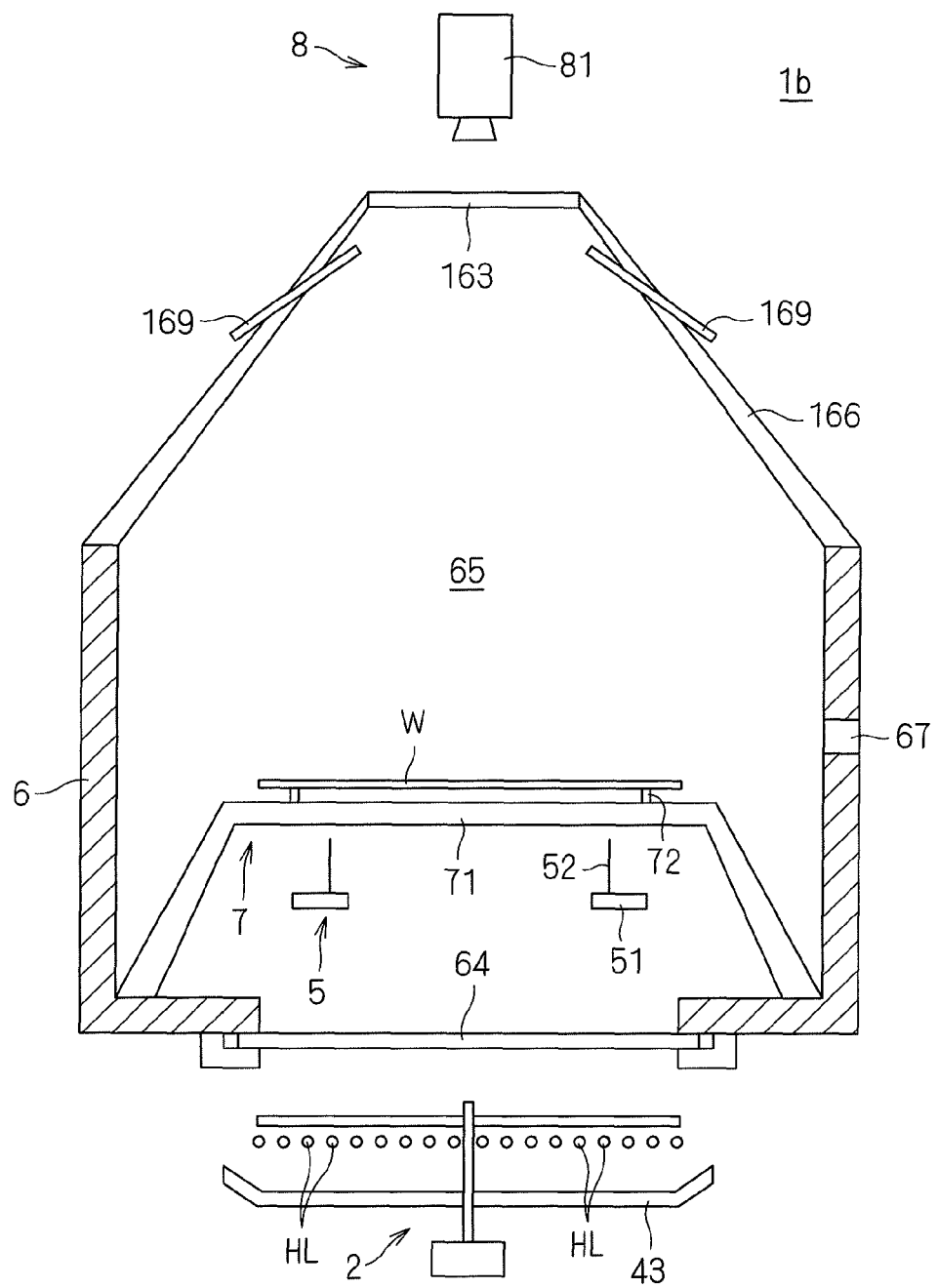
FIG. 11 is a diagram showing a configuration of principal parts of a heat treatment apparatus according to a third preferred embodiment.

Next, a third preferred embodiment of the present invention will be described. FIG. 11 is a diagram showing a configuration of principal parts of a heat treatment apparatus 1b according to the third preferred embodiment. In FIG. 11, the same parts as those of the first preferred embodiment are denoted by the same corresponding reference numerals. In the heat treatment apparatus 1b according to the third preferred embodiment, an infrared-transparent window 163 is arranged at a higher position and at a longer distance from the semiconductor wafer W as compared with the infrared-transparent window 63 of the first preferred embodiment.

In the third preferred embodiment, an upper wall 166 is provided at an upper end portion of the side wall of the chamber 6. The upper wall 166 is in the shape of a circular truncated cone. The upper wall 166 is made of, for example, stainless steel having an excellent heat resistance, and cooled by a water-cooling mechanism (not shown). The infrared-transparent window 163 is mounted to an upper end portion of the upper wall 166. In the third preferred embodiment, the diameter of the infrared-transparent window 163 is $\phi 50$ mm to $\phi 75$ mm, which is smaller than that of the first preferred embodiment.

The infrared-transparent window 163 is arranged at a high position by using the upper wall 166. Therefore, the distance between the infrared-transparent window 163 and the semiconductor wafer W held on the holder 7 is set to be 30 cm or more and 80 cm or less. The distance between the infrared-transparent window 163 and the infrared camera 81 of the temperature detection part 8 is set to be a value equal to or smaller than half the shortest distance of the depth of field in a case of focusing on the semiconductor wafer W as an object, similarly to the first preferred embodiment of the present invention.

Cooling tubes 169 are provided to the upper wall 166. The cooling tube 169 allows a cooling gas such as a nitrogen gas to be sprayed to a lower surface of the infrared-transparent window 163. Similarly to the first preferred embodiment, while at least the halogen lamps HL are turned on, the cooling gas is sprayed from the cooling tubes 169 to thereby keep the temperature of the infrared-transparent window 163 in the range of 150° C. or less (preferably, 100° C. or less), at which the infrared-transparent window 163 allows the infrared ray to transmit therethrough.

As for the rest of the configuration other than the above-described part, the heat treatment apparatus 1b according to the third preferred embodiment is the same as the first preferred embodiment. As for process steps performed on the semiconductor wafer W, too, the heat treatment apparatus 1b according to the third preferred embodiment is the same as the heat treatment apparatus 1 according to the first preferred embodiment.

In the third preferred embodiment, the infrared-transparent window 163 is arranged at a high position by using the upper wall 166, and thereby the infrared-transparent window 163 can be placed farther from the semiconductor wafer W and closer to the infrared camera 81. Therefore, even when the size of the infrared-transparent window 163 is reduced as compared with the first preferred embodiment, the entire surface of the semiconductor wafer W held on the holder 7 can be included in the viewing field of the infrared camera 81. This enables the infrared-transparent window 163 to be manufactured more simply at a lower cost.

Since the infrared-transparent window 163 is arranged at a distance from the semiconductor wafer W, the degree to which the infrared-transparent window 163 is heated by radiation heat generated from the semiconductor wafer W whose temperature has been raised is small. This can reduce the load for cooling put on the cooling tube 169. Additionally, the same effects as those of the first preferred embodiment are obtained.

Modification

While some preferred embodiments of the present invention have been described hereinabove, various modifications of the present invention in addition to those described above may be made without departing from the scope and spirit of the invention. For example, although the infrared-transparent window 63 (or 163) is made of silicon in the preferred embodiments described above, this is not limiting. Any material may be adopted as long as the material allows an infrared ray in a wavelength region detectable by the infrared camera 81 to transmit therethrough. For example, the infrared-transparent window 63 (or 163) may be made of germanium (Ge) or sapphire ($Al_2O_3$). However, a circular disk made of silicon is relatively readily available, and therefore silicon is preferable from the viewpoint of manufacturing costs.

Additionally, instead of air-cooling the infrared-transparent window 63 (or 163), water-cooling may be adopted. In a case of cooling the infrared-transparent window 63 by means of water-cooling, too, the infrared-transparent window 63 is cooled to 150° C. or less, at which the infrared-transparent window 63 allows an infrared ray emitted from the semiconductor wafer W to transmit therethrough.

In the preferred embodiments described above, the infrared-transparent window 63 and the quartz window 64 are arranged at the upper end and the lower end of the chamber 6, respectively, and moreover the infrared camera 81 and the halogen lamps HL are arranged above and below the chamber 6, respectively. This arrangement may be reversed. More specifically, it may be possible that the quartz window 64 is arranged at the upper end of the chamber 6 while the halogen lamps HL of the light irradiation part 4 are arranged above the chamber 6. Here, the laser light emission part 25 of the temperature correction part 2 is also arranged above the chamber 6. On the other hand, the infrared-transparent window 63 is arranged at the lower end of the chamber 6 while the infrared camera 81 of the temperature detection part 8 is arranged below the chamber 6. In this case, light emitted from the halogen lamps HL is radiated to the front surface of the semiconductor wafer W on which a pattern is formed. Then, the semiconductor wafer W whose temperature has been raised emits, from the back surface thereof, an infrared ray, which then transmits through the infrared-transparent window 63 and is detected by the infrared camera 81. In this case as well, similarly to the preferred embodiments described above, the temperature of the entire surface of the semiconductor wafer W can be two-dimensionally detected without rotating the semiconductor wafer W, and the temperature is corrected based on a result of the detection to thereby achieve a uniform temperature distribution throughout the entire surface of the semiconductor wafer W.

In the preferred embodiments described above, the temperature drop region is heated by irradiation with the laser light emitted from the temperature correction part 2. However, depending on the degree of the temperature drop, the temperature drop region may be heated by both the light irradiation part 4 and the temperature correction part 2. Even when the laser unit 21 is adapted for a semiconductor laser having a high output of 500 W, a temperature range correctable by irradiation with the laser light emitted from the laser light emission part 25 is about several tens of ° C. Therefore, in a case where the temperature of the temperature drop region is lower than the temperature of the other regions by 100° C. or more, it is conceivable to firstly increase an output of the halogen lamps HL positioned immediately below this temperature drop region and then, when any temperature drop region still remains, remove the temperature drop region by heating it by irradiation with the laser light emitted from the temperature correction part 2 similarly to the preferred embodiments described above.

Moreover, instead of rotating the laser light emission part 25 that is a rod-shaped optical member, a mechanism for causing laser light to scan in a two-dimensional plane (in XY directions) is adoptable. Examples of such a mechanism include a galvano mirror. Using the galvano mirror enables the temperature to be corrected in any portion of the entire surface of the semiconductor wafer W. However, in a case of using the laser light emission part 25 of the preferred embodiments described above, there is no risk of interfering with the halogen lamps HL, because the laser light emission part 25 is provided so as to extend through the gap of the arrangement of the halogen lamps HL so that the laser light is emitted at a position above the halogen lamps HL in the upper stage.

In the second preferred embodiment, the laser light receiving part 85 is made of quartz. Instead, the laser light receiving part 85 may be made of germanium or sapphire.

The number of the infrared cameras 81 provided in the temperature detection part 8 is not limited to one. A plurality of infrared cameras 81 may be provided. In a case where a plurality of infrared cameras 81 are provided, results of imaging obtained by the respective infrared cameras 81 may be combined to prepare a temperature map of the entire surface of the semiconductor wafer W.

The substrate serving as a processing object of the heat treatment technique according to the present invention is not limited to a semiconductor wafer. A glass substrate for use in a flat panel display of a liquid crystal display device or the like, or a substrate for use in a solar cell, is adoptable.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate by irradiating said substrate with light, said heat treatment apparatus comprising:
   a chamber configured to receive a substrate;
   a holding part configured to hold the substrate within said chamber;

a quartz window arranged at one end of said chamber;

a halogen lamp configured to irradiate one side of the substrate held on said holding part with light through said quartz window;

a temperature detection part configured to receive an infrared ray emitted from the other side of the substrate held on said holding part, and two-dimensionally detect the temperature of said the other side;

an infrared-transparent window arranged at the other end of said chamber and configured to allow an infrared ray in a wavelength region detectable by said temperature detection part to transmit therethrough; and a temperature correction part configured to, based on a result of the detection obtained by said temperature detection part, heat a temperature drop region having a relatively low temperature among a region of the substrate held on said holding part.

2. The heat treatment apparatus according to claim 1, wherein said infrared-transparent window is made of silicon, germanium, or sapphire.

3. The heat treatment apparatus according to claim 2, further comprising a window cooling part configured to cool said infrared-transparent window to 150° C. or less.

4. The heat treatment apparatus according to claim 1, wherein the distance between said infrared-transparent window and the substrate held on said holding part is 30 cm or more.

5. The heat treatment apparatus according to claim 1, wherein said temperature correction part includes a laser light irradiation part configured to irradiate said one side of said temperature drop region of the substrate held on said holding part with laser light through said quartz window.

6. The heat treatment apparatus according to claim 5, wherein said laser light irradiation part includes:

a laser light emission part provided along a central axis of the substrate held on said holding part and configured to emit laser light to a peripheral portion of said substrate; and a first rotation part configured to rotate said laser light emission part about said central axis as the center of rotation.

7. The heat treatment apparatus according to claim 6, said laser light irradiation part further comprises a reciprocation part configured to reciprocate said laser light emission part, which is rotated by said first rotation part, along said central axis.

8. The heat treatment apparatus according to claim 1, wherein said temperature detection part includes an infrared camera configured to image an entire surface of said the other side of the substrate held on said holding part.

9. The heat treatment apparatus according to claim 6, wherein said temperature detection part further comprises:

a laser light receiving part configured to receive an infrared ray emitted from said the other side of a portion irradiated with the laser light emitted from said laser light emission part; and a second rotation part configured to rotate said laser light receiving part about said central axis as the center of rotation in synchronization with the rotation of said laser light emission part.

\* \* \* \* \*